United States Patent
Manlove et al.

(10) Patent No.: US 6,937,083 B2
(45) Date of Patent: *Aug. 30, 2005

(54) ANALOG SIGNAL CONDITIONING CIRCUIT HAVING FEEDBACK OFFSET CANCELLATION

(75) Inventors: Gregory J. Manlove, Kokomo, IN (US); Mark R. Keyse, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/966,233

(22) Filed: Oct. 15, 2004

(65) Prior Publication Data

US 2005/0052296 A1 Mar. 10, 2005

Related U.S. Application Data

(63) Continuation of application No. 10/462,177, filed on Jun. 16, 2003, now Pat. No. 6,806,756.

(51) Int. Cl.[7] .............................................. H03L 5/00
(52) U.S. Cl. ...................................................... 327/307
(58) Field of Search ................................ 327/307, 331, 327/332, 363, 306, 77; 330/9, 190, 259

(56) References Cited

U.S. PATENT DOCUMENTS

| | | | |
|---|---|---|---|
| 3,824,481 A | 7/1974 | Sponholz et al. | 327/101 |
| 4,229,703 A | 10/1980 | Bustin | 327/307 |
| 5,352,938 A | 10/1994 | Wise et al. | 327/72 |
| 5,523,676 A | 6/1996 | Bach et al. | 324/103 P |
| 5,945,853 A | 8/1999 | Sano | 327/87 |
| 6,054,887 A | 4/2000 | Horie et al. | 327/307 |
| 6,066,976 A | 5/2000 | Cho | 327/350 |
| 6,426,663 B1 | 7/2002 | Manlove et al. | 327/307 |
| 6,538,490 B2 | 3/2003 | Yoshizawa | 327/307 |
| 6,657,488 B1 | 12/2003 | King et al. | 330/9 |
| 6,664,840 B2 | 12/2003 | Cahalane et al. | 327/307 |
| 6,690,225 B2 | 2/2004 | Kondo et al. | 327/307 |

*Primary Examiner*—Tuan T. Lam
(74) *Attorney, Agent, or Firm*—Stefan V. Chmielewski

(57) ABSTRACT

Analog signal conditioning circuitry is provided for processing an analog signal generated by a sensor to remove DC offset. The signal conditioning circuitry includes an amplifier having the first input receiving an analog input signal and a second input receiving a reference signal. The amplifier includes an output providing an analog output signal defined by an amplified representation of the analog input signal and the reference signal. The circuitry includes a feedback circuit having an input coupled to the amplifier output and an output coupled to the first input of the amplifier for providing an analog feedback signal. The feedback circuit includes an analog-to-digital converter for converting the analog amplifier output to a digital signal, a digital controller for processing the digital signal, and a digital to analog converter for converting the processed digital signal to an analog feedback signal.

3 Claims, 3 Drawing Sheets

ANALOG SIGNAL CONDITIONING CIRCUIT HAVING FEEDBACK OFFSET CANCELLATION

CROSS REFERENCE TO RELATED APPLICATION

The present application is a continuation application of U.S. application Ser. No. 10/462,177 filed on Jun. 16, 2003, now U.S. Pat No. 6,806,756.

TECHNICAL FIELD

The present invention generally relates to offset compensation circuitry and, more particularly, to signal conditioning circuitry for compensating for offset variations in an analog signal, such as a sensor (e.g., accelerometer) generated analog output signal.

BACKGROUND OF THE INVENTION

Air bag systems are commonly used in automotive applications to provide protection for the vehicle operator and/or passengers in the vehicle in the event of a vehicular collision. Known techniques for implementing an air bag system in a vehicle generally include detecting vehicular deceleration via an accelerometer (i.e., acceleration sensor). The accelerometer generates an analog output signal that is processed to determine if an impact of sufficient severity has occurred to require deployment of one or more air bags in the vehicle.

Various types of accelerometers are known, some of which include piezo-resistive sensors, typically micromachined, that produce a differential analog output voltage proportional to the applied acceleration (or deceleration).

Applications that employ accelerometers typically include signal conditioning circuitry for amplifying the sensor generated analog output signal and compensating for gain and offset to account for temperature variations and manufacturing tolerance variations. Some conventional signal conditioning circuitry for accelerometers employed in vehicle air bag systems may require a gain of approximately 250, according to one example, to produce sufficient amplitude acceleration signals that may be used to discriminate a vehicle collision using analog-to-digital converters present in many microprocessors. Additionally, in order to determine valid impact discrimination, the output offset generated by the sensor and processed by any associated signal conditioning circuitry typically is required to be less than 20 millivolts. Typical automotive applications operate throughout a temperature range of about −40° to +125° Celsius, which requires the signal offset variation to be less than about 0.5 microvolts per degree Celsius.

Numerous techniques have been devised for minimizing offset in sensor generated analog signals employed in vehicle air bag systems. One such technique for minimizing offset in an analog signal is disclosed in U.S. Pat. No. 6,426,663, entitled "ANALOG/DIGITAL FEEDBACK CIRCUITRY FOR MINIMIZING DC OFFSET VARIATIONS IN AN ANALOG SIGNAL", which is hereby incorporated herein by reference. The approach disclosed in the aforementioned U.S. patent employs a combination analog and digital feedback circuit coupled between the output and input of a gain stage amplifier. The feedback circuit employs a comparator, a clock circuit, and an up/down counter for slowly incrementing or decrementing a digital output signal that is converted to an analog signal via a digital-to-analog converter. The incrementally adjusted analog signal is applied to the input of the amplifier as a feedback signal to compensate for slowly varying DC offset.

While the aforementioned conventional feedback circuit offers significant advantages over prior analog integrator feedback circuits, a number of limitations do exist. First, the conventional feedback circuit is required to transition from an initial DC offset to the desired output value through a series of incremental values. For the conventional circuit to operate as designed, the analog output voltage signal must reach the final value before the next clock can transition the feedback signal. This results in a speed limitation in the analog signal limited by the maximum clock rate of the counter, which can cause a start up delay that delays the use of the sensor. Second, because the start up time is a function of the initial offset, the start up time becomes greater as the offset becomes greater. Third, the start up time can increase significantly, particularly if filter bandwidth is reduced. This is because the analog output voltage signal must be able to keep up with the feedback signal or the feedback signal may overshoot and not stop at the desired value. Fourth, the analog output signal generated by the conventional approach may not settle on a final value, as it continues to transition up and down around the desired center value. This results in a theoretical noise floor for the system that can limit system performance. Further, the decision to update the up/down counter in the prior approach is made at the rising edge of the clock. Spurious noise on the analog output signal at that critical instant could cause the comparator output to transition high or low when the average value is the opposite. This may cause the up/down counter to transition up and down and adversely impact noise on the system which makes it more difficult to predict the system impact.

Accordingly, it is therefore desirable to provide for a signal conditioning circuit for compensating for DC offset in an analog signal which eliminates or reduces limitations in the prior art. In particular, it is desirable to provide for a signal conditioning circuit having a feedback circuit that may quickly compensate for DC offset. Additionally, it is desirable to provide for a feedback circuit that compensates for DC offset in a manner that eliminates or reduces transitioning variations in the analog output signal.

SUMMARY OF THE INVENTION

According to one aspect of the present invention, analog signal conditioning circuitry is provided including an amplifier having a first input receiving an analog input signal and a second input receiving a reference signal. The amplifier includes an output providing an analog output signal defined by an amplified representation of the analog input signal and the reference signal. The circuitry also includes a feedback circuit having an input coupled to the amplifier output and an output coupled to the first input of the amplifier for providing an analog feedback signal. The feedback circuit includes an analog-to-digital converter for converting the analog amplifier output to a digital signal. The feedback circuit also includes a digital controller for processing the digital signal to compensate for offset in the analog output signal. The feedback circuit further includes a digital-to-analog converter for converting the processed digital signal to an analog feedback signal.

According to another aspect of the present invention, a feedback circuit is provided for compensating for DC offset variations in an analog output signal of an analog signal conditioning circuit having an amplifier, an input for receiving an analog input signal, and an output for providing an amplified output signal. The feedback circuit includes an analog-to-digital converter coupled to the output of the amplifier for converting the analog output signal to a digital signal, a digital controller coupled to the analog-to-digital converter for processing the digital signal to compensate for offset in the analog output signal, and a digital-to-analog converter coupled to an output of the digital controller for converting the compensated digital signal to an analog feedback signal. The feedback signal is applied as an input to an amplifier to compensate for DC offset in an analog output signal.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
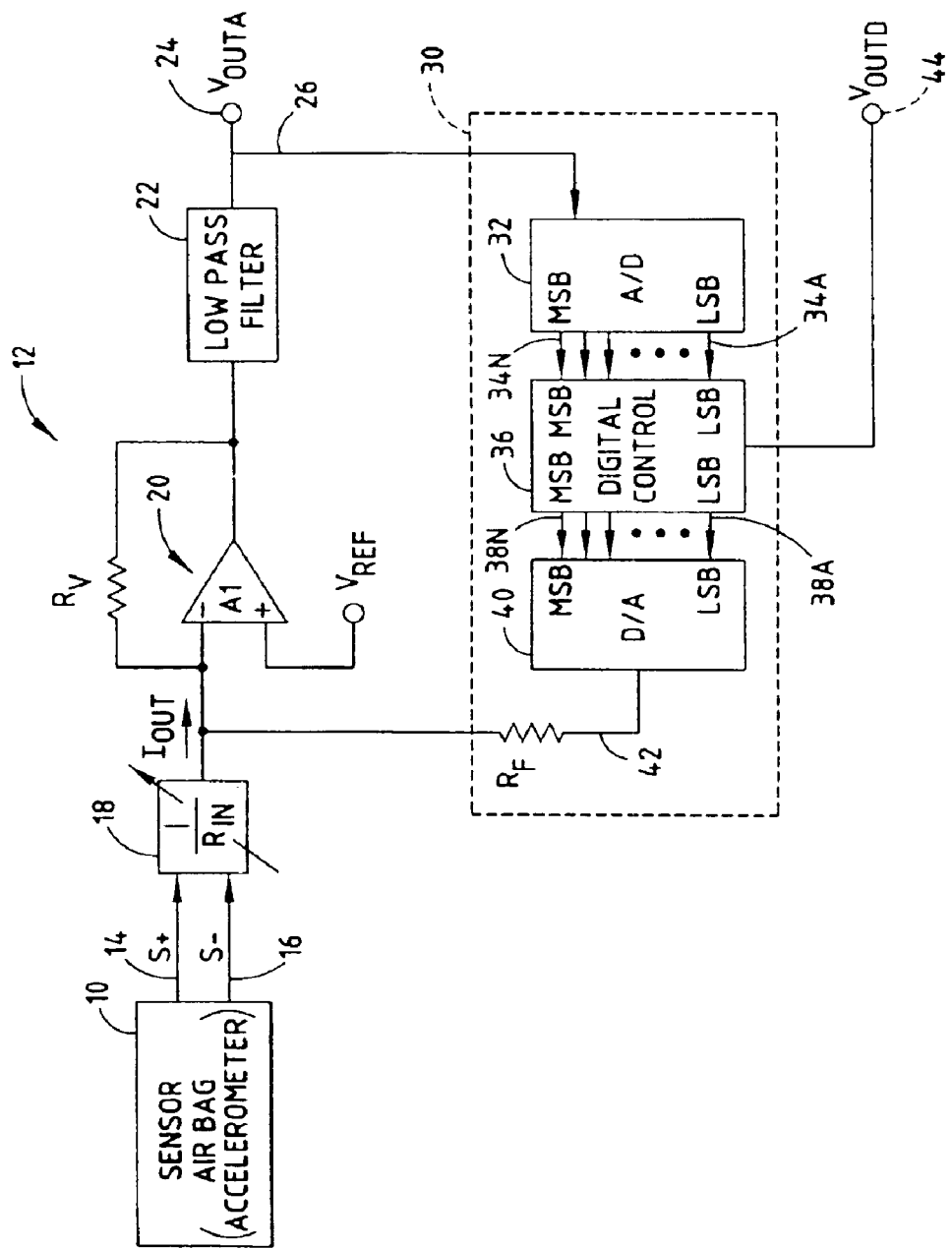
FIG. 1 is a block/circuit diagram illustrating a sensor and signal conditioning circuitry having a feedback circuit for compensating for DC offset in an analog signal according to the present invention.

Referring to FIG. 1, an analog signal processing circuit 12 is shown processing an analog output signal generated by a sensor 10 according to the present invention. The analog signal processing circuit 12, also referred to herein as signal conditioning circuitry, processes the analog output signal generated by sensor 10 to produce one or more conditioned output signals such as analog output signal $V_{OUTA}$ at output terminal 24 and digital output signal $V_{OUTD}$ at output terminal 44. The analog signal processing circuit 12 provides signal amplification and removes noise from the sensor generated analog output signal, as should be evident to those skilled in the art. Circuit 12 may be employed to process any of a number of analog signals to amplify the signal and compensate for gain and offset errors, and is particularly well suited to process analog signals generated by various types of analog signal generating sensors, such as an air bag accelerometer.

The signal processing circuit 12 includes first and second differential inputs 14 and 16 for receiving a differential output signal, defined by analog signals S+ and S−, that is proportional to an acceleration or deceleration applied to accelerometer sensor 10. The differential analog output signal (S+−S−) generated by sensor 10 may include a direct current (DC) offset signal component due to offset error and may include an AC signal component due to sensed acceleration or deceleration. The analog signal processing circuit 12 advantageously reduces or eliminates the DC offset signal according to the present invention as described herein.

The differential inputs 14 and 16 of the analog signal processing circuit 12 are coupled to a transimpedence input stage 18 which generates a differential output current $I_{OUT}$. The transimpedence input stage 18 includes a variable resistance $R_{IN}$ that may be adjusted to vary the gain (amplification) of the circuit 12. The differential output current $I_{OUT}$ is proportional to the sensor output differential voltage defined by the difference in signals S+ and S− divided by variable resistance $R_{IN}$.

The output of the transimpedence input stage 18 is coupled to an input of an amplification gain stage 20 having an amplifier A1. The amplifier A1 has a non-inverting (positive) input (+) coupled to and referenced at a reference voltage $V_{REF}$. According to one embodiment, reference voltage $V_{REF}$ is set to a mid-supply voltage which, according to one example, is set to about 2.5 volts of a full supply voltage of 5.0 volts. The inverting (negative) input (−) of amplifier A1 is coupled to the output of the transimpedence input stage 18 for receiving the sensor generated differential analog output current $I_{OUT}$. As a consequence, differential current $I_{OUT}$ is applied to a virtual ground of amplifier A1. Also coupled to the inverting input (−) of amplifier A1 are resistors $R_V$ and $R_F$. Resistor $R_V$ is connected between the inverting input (−) and the output of amplifier A1. Resistor $R_F$ is connected in a feedback path 30 that applies an analog feedback signal to the inverting input (−) of amplifier A1 as described herein.

The gain stage 20 generates an amplified analog signal that includes the sum of the sensor generated analog signal and the feedback signal multiplied by the gain of gain stage 20. The output of amplifier A1, which also serves as an output of gain stage 20, is connected as an input to a low pass filter 22. The low pass filter 22 removes undesired resonant frequency effects from the amplified analog signal. According to one embodiment, the low pass filter 22 may include a first-order switched capacitor low pass filter. The output of low pass filter 22 is connected to analog output terminal 24 for supplying the analog output voltage $V_{OUTA}$.

The analog signal processing circuit 12 according to the present invention includes a feedback path 26 having feedback circuit 30. The feedback circuit 30 processes the analog output voltage $V_{OUTA}$ to generate an analog feedback signal on feedback output line 42 that, in turn, is applied as an input to the inverting input (−) of amplifier A1. The analog feedback signal is summed with the differential analog output current $I_{OUT}$ at the input of the gain stage 20 to adjust for slowly varying DC offset present in the analog output current $I_{OUT}$. In particular, the feedback circuit 30 provides an analog feedback signal in an attempt to maintain the DC component of the analog output voltage $V_{OUTA}$ at a reference voltage which, according to the embodiment described herein, is set at a mid-supply voltage of about 2.5 volts.

The feedback circuit 30 includes an analog-to-digital converter 32 having an input coupled to feedback path 26 for receiving the analog output voltage $V_{OUTA}$. The analog-to-digital converter 32 converts the analog output voltage $V_{OUTA}$ to a digital signal represented by a digital word having N-bits. According to one embodiment, the analog-to-digital converter 32 includes a 10-bit digital word capable of converting the analog input into one of one thousand twenty four (1024) possible digital values. In this example, the digital word is defined by a series of 10-bits in binary code extending from the least significant bit (LSB) to the most significant bit (MSB). According to other embodiments, the analog-to-digital converter 32 may have 9-bits providing 512 digital values or 8-bits providing 256 digital values, for example. The digital word having N-bits is output on lines 34A–34N.

The feedback circuit 30 also includes a digital controller 36 coupled to the output lines 34A–34N of analog-to-digital converter 32. The digital controller 36 may include a microprocessor based controller having a processor and memory, according to one embodiment. Alternately, the digital controller 36 may include discreet circuitry, according to another embodiment. The digital controller 36 receives the digital word provided on lines 34A–34N and performs a control routine to generate a digital control signal to reduce or eliminate DC offset in the sensor generated analog output signal. The digital processing performed by digital controller 36 includes comparing the digital word of the output voltage $V_{OUTA}$ provided on lines 34A–34N to a reference voltage, such as a mid-supply voltage, and generating a corrected offset value to force the analog voltage output $V_{OUTA}$ towards the mid-supply reference voltage, as explained herein. The digital controller 36 outputs the corrected offset value as an N-bit digital word on output lines 38A–38N. According to one embodiment, the digital controller 36 provides a 10-bit digital word defining the corrected offset value. The digital controller 36 may output the offset value in other size digital words such as 8-bit or 9-bit digital words. Additionally, the digital controller 36 provides a digital output voltage $V_{OUTD}$ to digital output terminal 44 which serves as a digital version of the analog output voltage $V_{OUTA}$.

The feedback circuit 30 further includes a digital-to-analog converter 40 for receiving the digital word on lines 38A–38N output from digital controller 36 and converting the digital word to an analog feedback signal on feedback output line 42. The digital-to-analog converter 40 has N-bit inputs to convert the digital N-bit binary coded word to an analog feedback signal. The digital-to-analog converter 40, digital controller 36, and analog-to-digital converter 32 preferably operate with the same size digital word made up of N-bits. Accordingly, the digital word containing the DC offset correction signal is converted to an analog feedback correction signal on feedback output line 42. The analog feedback correction signal on line 42 is coupled to the inverting input (–) of amplifier A1 via the feedback resistor $R_F$. The gain between feedback line 42 and the analog output voltage $V_{OUTA}$ is set equal to minus one (–1), according to one embodiment.

Figure 2:
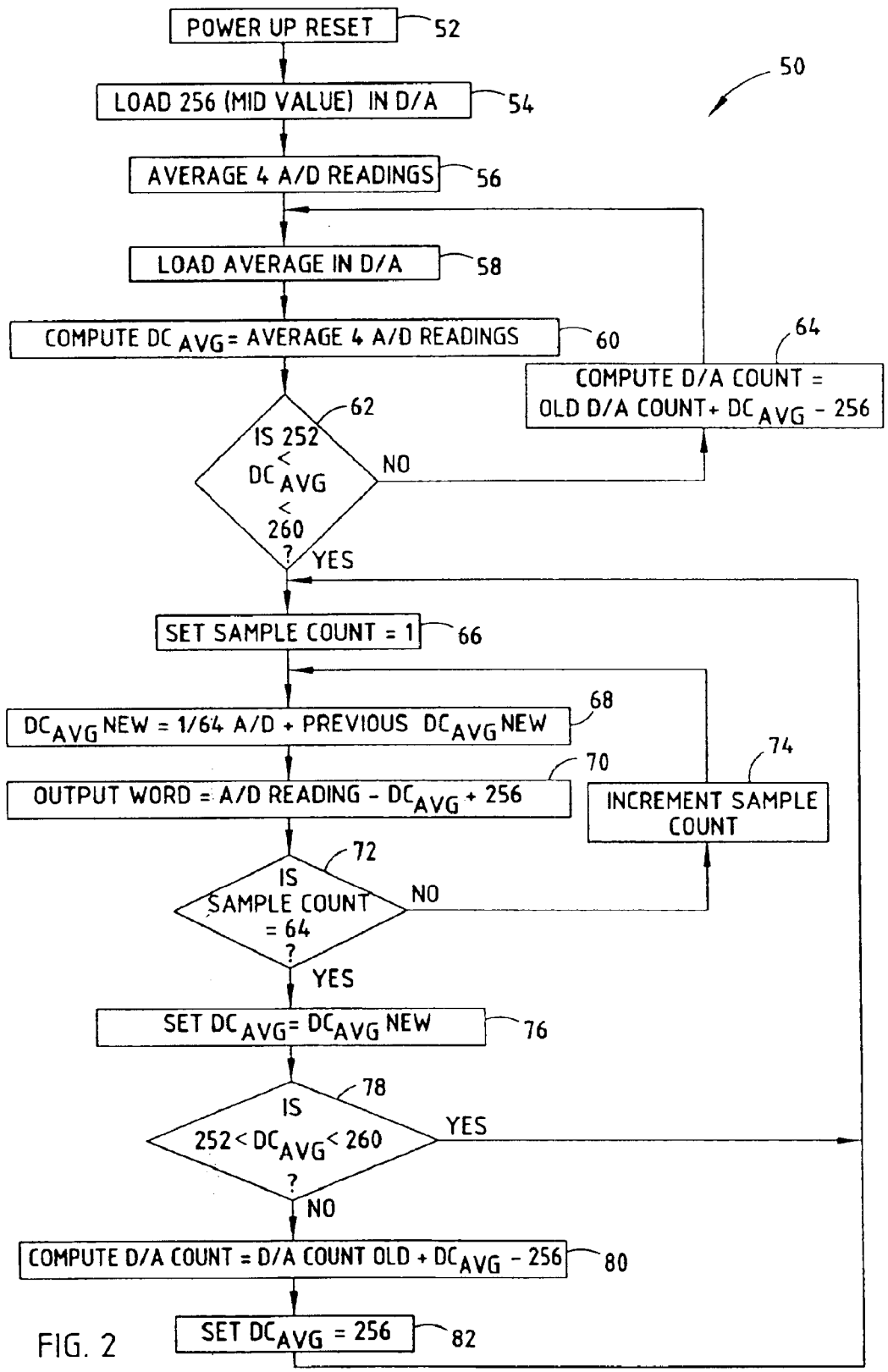
FIG. 2 is a flow diagram illustrating a method of compensating for DC offset in the analog signal.

Referring to FIG. 2, a method 50 is illustrated for compensating for DC offset in the analog signal according to the present invention. The method 50 may be processed by a microprocessor and memory in a digital controller, according to one embodiment, or may be implemented in discreet control circuitry, according to another embodiment. It should be appreciated that the method 50 described herein is performed by the digital controller 36 in the feedback circuit 30 to generate an offset correction feedback signal to compensate for DC offset in the sensor generated analog output signal.

Method 50 begins at step 52 by performing a reset at power up. The power up may include power up of a vehicle, when used in a vehicle air bag sensor application, according to one example. Following the power up reset, method 50 proceeds to load a middle digital word value into the digital-to-analog converter 40. In the 9-bit embodiment, the middle digital word value is set to a binary coded value of 256. By loading the middle digital word value of 256 into the digital-to-analog converter 40, the feedback signal on output line 42 of feedback path 26 is set to its middle value. Next, an average value of four digital word readings output from the analog-to-digital converter 32 are acquired in step 56. The average digital value output of the analog-to-digital converter 32 is then loaded as an average value into the digital-to-analog converter 40 in step 58. An average DC value $DC_{AVG}$ is then computed in step 60 by averaging the four most recent readings of the analog-to-digital converter 32. By averaging the signal four times and placing the average digital count in the digital-to-analog converter 40, the feedback circuit 30 may avoid noise that could otherwise cause the output signal to transition to an undesired value.

Once the average DC value $DC_{AVG}$ is computed, method 50 proceeds to decision step 62 to determine if the computed value $DC_{AVG}$ is within a range defined by digital values 252 to 260. The range 252 to 260 defines a count of +/–4 counts from the mid-supply reference count of 256, which defines an acceptable initial range. If the computed value $DC_{AVG}$ is not within the range of values 252 to 260, routine 50 proceeds to compute a digital-to-analog converter count by adding the most recent computed value $DC_{AVG}$ to the old digital-to-analog converter count and subtracting the mid-supply reference value of 256 in step 64. With the newly computed digital-to-analog count in step 64, method 50 returns to repeat steps 58 through 62.

If the computed value $DC_{AVG}$ is within the digital count range of values 252 to 260, method 50 proceeds to set a sample count value equal to a value of 1 in step 66 to begin a counter for averaging 64 samples. Next, method 50 averages a set of 64 samples, once every millisecond in steps 68 through 72. This includes generating the average value $DC_{AVG}$NEW as a function of a fraction (1/64th) of the current analog-to-digital values summed with the previous $DC_{AVG}$NEW in step 68, and generating an output word equal to the difference in the analog-to-digital converter reading and the computed value $DC_{AVG}$ summed with a mid-supply count value of 256 in step 70. Method 50 then checks for whether the sample count has reached sixty-four in decision step 72 and, if not, increments the sample count by a value of 1 and returns to step 68. Steps 68–74 are repeated until the sample count equals sixty-four to acquire an average value output word over a set of sixty-four consecutive samples. By averaging a sufficient number (e.g., 64) of calculations, method 50 thus prevents random instantaneous noise in the analog output from causing the DC value to wander from the actual value. The DC averaging also eliminates transitioning present in prior approaches.

Once the average value over a set of sixty-four samples is acquired, method 50 proceeds to set the average value $DC_{AVG}$ equal to the newly acquired DC average value $DC_{AVG}$NEW using the sixty-four averaged samples in step 76. Next, in decision step 78, method 50 checks for whether the average DC value $DC_{AVG}$ is within the count range of 252 to 260 and, if so, returns to step 66. When the average value $DC_{AVG}$ is within the count range of 252 to 260, method 50 decides that no further adjustment to the offset is needed. However, if the average value $DC_{AVG}$ is not within the range defined by count 252 to 260, method 50 proceeds to compute a new digital-to-analog converter count value in step 80. The new digital-to-analog converter count value is computed by summing the old digital-to-analog converter count value with the average value $DC_{AVG}$ and subtracting the count value of 256. Thereafter, method 50 sets the average value $DC_{AVG}$ equal to a count value of 256 and returns to step 66. Accordingly, the digital-to-analog converter 42 is set to generate a feedback signal to compensate for DC offset in the sensor generated analog output signal.

Figure 3:
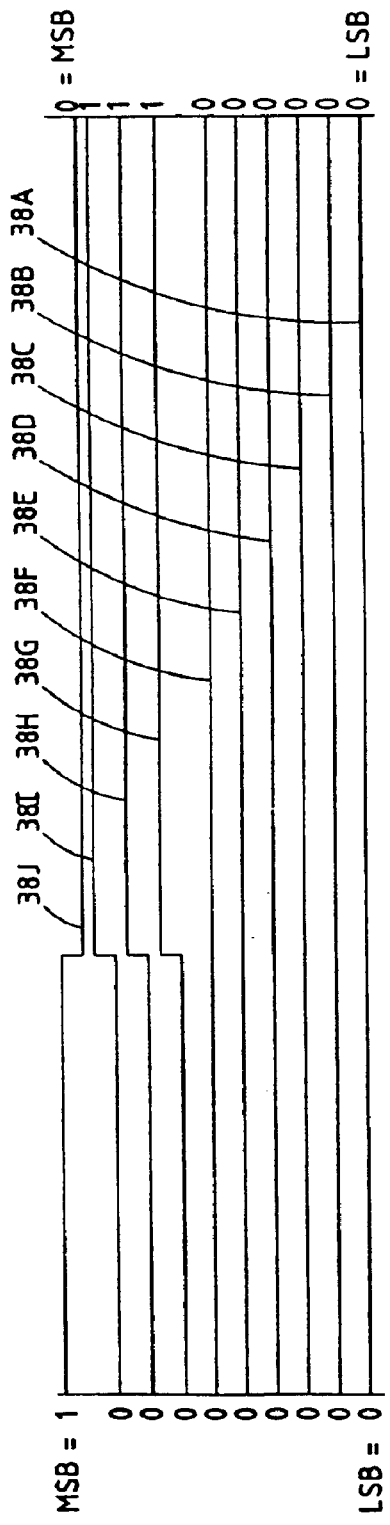
FIG. 3 is a graph illustrating feedback compensation of DC offset during a vehicle startup, according to one example.
Figure 3:
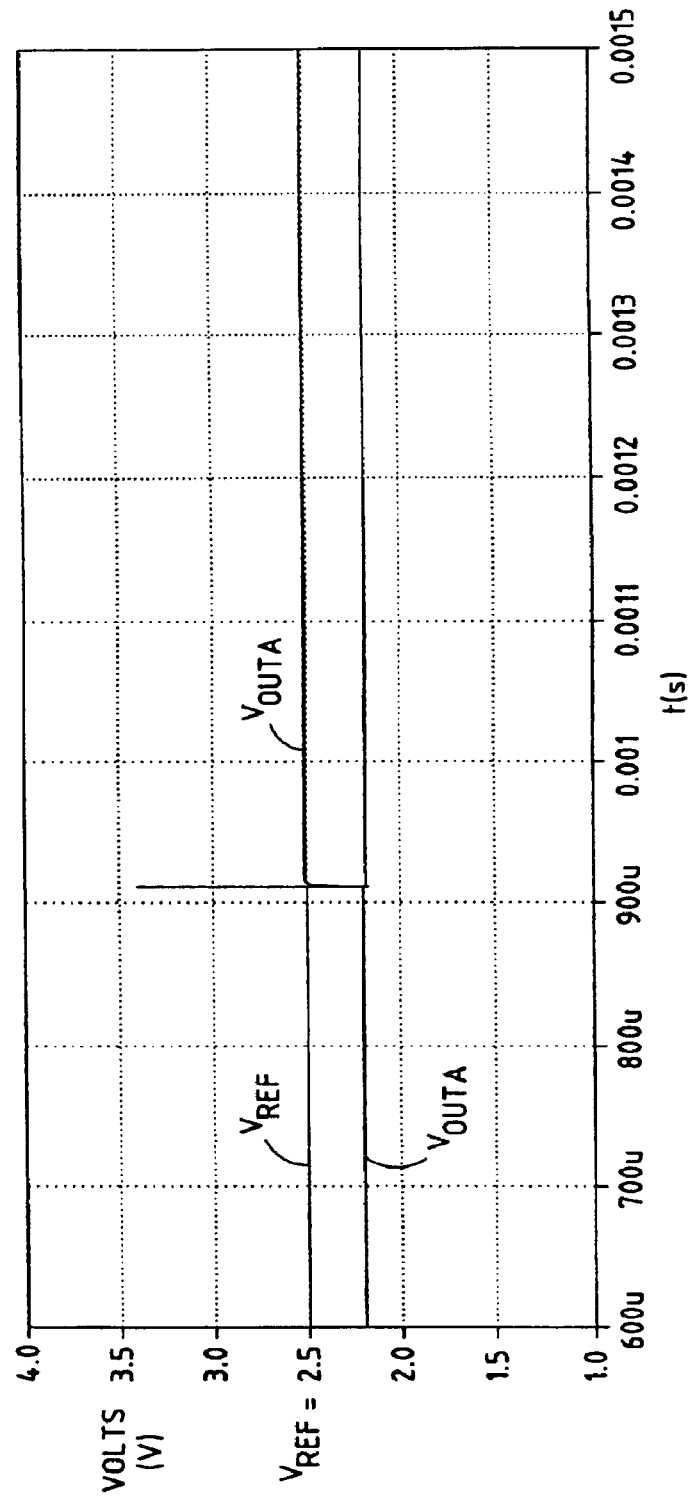

Referring to FIG. 3, the analog output voltage $V_{OUTA}$ response as a function of time is generally shown on a graph during and following the power up reset. As shown, the output of the digital controller input to the digital-to-analog converter on lines 38A–38J has a digital binary coded word 1000000000 at time t=600 microseconds. At a time shortly after t=900 microseconds, the digital control output on lines 38A–38J transitions to a digital binary coded word of 0111000000. During this power up time period, the digital controller 36 computes an initial DC offset to generate a feedback signal to quickly adjust for DC offset in the sensor generated analog output signal with a single quick transition applied via the feedback signal. At this time, the analog voltage output $V_{OUTA}$ transitions from a value of approximately 2.2 volts to a mid-supply value of about 2.5 volts with a relatively quick single step as shown. Thus, the DC offset present in the sensor generated analog output $V_{OUTA}$ may be quickly adjusted shortly following power up. Additionally, it should be appreciated that the analog output voltage $V_{OUTA}$ remains substantially steady as the digital controller 36 continuously adjusts the feedback signal to compensate for any slowly varying DC offset drift that may be present in the sensor output. This includes adjusting for any DC offset caused by manufacturing tolerance deviations and temperature variations.

Accordingly, the analog signal conditioning (processing) circuit 12 according to the present invention advantageously provides for a feedback circuit 30 that quickly and efficiently reduces or eliminates the DC offset present in an analog signal, such as an analog output signal generated by sensor 10. By employing an analog-to-digital converter 32, a digital controller 36, and a digital-to-analog converter 40 in the feedback path 26, the feedback circuit 30 is able to quickly adjust for DC offset in the analog signal and to continuously adjust for slowly varying DC offset, while allowing accurate measurement of a sensed condition (e.g., acceleration).

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. Analog signal conditioning circuitry comprising:

an amplifier having a first input receiving an analog input signal corresponding to an output signal generated by a sensor and a second input receiving a reference signal, said amplifier further comprising an output for providing an analog output signal defined by an amplified representation of the analog input signal and the reference signal; and a feedback circuit having an input coupled to said amplifier output and an output coupled to the first input of the amplifier for providing an analog feedback signal thereto, said feedback circuit comprising an analog-to-digital converter for converting the analog amplifier output to a digital signal, a digital controller for processing the digital signal to compensate for offset in the analog output signal, and a digital-to-analog converter for converting the processed digital signal to the analog feedback signal, wherein the digital controller determines an amount of offset in the digital signal as compared to the reference signal and generates a processed digital feedback signal to compensate for the determined offset, and wherein the digital controller further for computing an average of digital signal outputs of the analog-to-digital converter and compensating for the determined offset when the difference between the average value and an expected value exceeds a predetermined value.

2. The signal conditioning circuitry as defined in claim 1, further comprising a transimpedence circuit coupled to the first input of the amplifier.

3. The signal conditioning circuitry as defined in claim 1, further comprising a low pass filter coupled to the output of the amplifier.

* * * * *